United States Patent
Steinlechner

(10) Patent No.: US 6,249,238 B1
(45) Date of Patent: Jun. 19, 2001

(54) SIGMA-DELTA MODULATOR AND METHOD FOR SUPPRESSING A QUANTIZATION ERROR IN A SIGMA-DELTA MODULATOR

(75) Inventor: Siegbert Steinlechner, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/404,071

(22) Filed: Sep. 23, 1999

(30) Foreign Application Priority Data

Nov. 10, 1998 (DE) .............................................. 198 51 637

(51) Int. Cl.[7] ...................................................... H03M 3/00
(52) U.S. Cl. ............................ 341/143; 375/28; 375/350; 375/111; 364/724.1; 364/133; 364/494; 364/602; 387/29; 387/31; 387/34; 387/36; 377/42; 377/48; 377/76; 340/347
(58) Field of Search ..................................... 341/143, 131, 341/144, 139, 133, 171, 118, 159

(56) References Cited

U.S. PATENT DOCUMENTS

| | | | |
|---|---|---|---|
| 5,010,347 | * 4/1991 | Yukawa | 341/143 |
| 5,055,843 | * 10/1991 | Ferguson | 341/143 |
| 5,144,308 | * 9/1992 | Norsworthy | 341/131 |
| 5,598,159 | * 1/1997 | Hein | 341/143 |
| 5,724,038 | * 3/1998 | Koifman et al. | 341/144 |
| 5,745,061 | * 4/1998 | Norsworthy | 341/131 |

FOREIGN PATENT DOCUMENTS 198 190 69   4/1998 (DE) .

OTHER PUBLICATIONS

"IIR Filtering on Sigma–Delta Modulated Signals", D.A. Johns et al, Electronics Letters 14. Feb. 1991, vol. 27, Nr. 4.
Nonlinear Arithmetic Operations on the Delta Sigma Pulse Stream, M. Freedman et al, Signal Processing 21 (1990), pp. 25–35, Elsevier Science Publishers.
"A Use of Double Integration in Sigma Delta Modulation", J. Candy, IEEE, Transactions On Communications, Mar. 1985.
"Theory and Practical Implementation of a Fifth–Order Sigma–Delta A/D Converter", R. W. Adams et al, Audio Eng. Soc., vol. 39, Nr. 7/8, 1991.

* cited by examiner

Primary Examiner—Michael Tokar
Assistant Examiner—Lam T. Mai
(74) Attorney, Agent, or Firm—Michael J. Striker

(57) ABSTRACT

A sigma-delta modulator is disclosed for conversion of an analog or digital low frequency signal of high resolution into a quantized analog or digital signal, with an error feedback circuit for suppression of quantization errors. The sigma-delta modulator includes a delay device ($Z^{-1}$) for delaying the input signal (X) for a plurality of scanning periods to obtain a plurality of delayed input signals ($X_i$), wherein i=1, 2, . . . , n and the ith one of the delayed input signals ($X_i$) is delayed for i scanning periods; an adder (2) for addition of the delayed input signals ($X_i$) each delayed by the i scanning periods to obtain a first sum signal ($S_1$); a quantizing device (Q, $Q_0$, $Q_1$ to $Q_n$) for producing quantized input signals ($VZ_i$) each delayed by the ith scanning period; an adder (3) for addition of the delayed quantized input signals ($VZ_i$) to obtain a second sum signal ($S_2$); and a subtraction device (1) for subtraction of the sum signals ($S_1$, $S_2$) from an actual value of the input signal (X).

4 Claims, 5 Drawing Sheets

SIGMA-DELTA MODULATOR AND METHOD FOR SUPPRESSING A QUANTIZATION ERROR IN A SIGMA-DELTA MODULATOR

BACKGROUND OF THE INVENTION

1. Field of the Invention

The present invention relates to a sigma-delta modulator for conversion of a an analog or digital low-frequency input signal of a high resolution into a quantized analog or digital signal, which has an error feedback circuit for suppression of quantization errors. It also relates to a method for suppressing quantization errors in this type of sigma-delta modulator.

2. Prior Art

Sigma-delta modulators convert low frequency signals of high resolution, which can be in analog or digital form, into scanned, coarse quantized signals with a comparatively high scan rate. This output signal can similarly be prepared in analog or digital form. Quantization noise arises because of this coarse quantization (often only a single bit is used for the quantization). An attempt is made to shape this noise by error feedback so that the noise spectrum in the interesting low frequency band (the frequency band for the input signal) is very small, but increases at higher frequencies. High frequency noise may be largely eliminated by a low-pass filter.

A sigma-delta modulator can be used, for example, as an analog/digital converter (A/D converter); an analog input signal is converted into a high frequency digital pulse sequence with a weight of ±1, for example. The reverse, namely the use of a sigma-delta modulator as a digital/analog converter (D/A converter), is also possible. The digital input signal, for example, has a 16-bit word length with a scanning rate of, e.g., 48 kHz. The output signal can be, for example, a high frequency sequence of discrete analog values (for example ±1 volt with a scanning rate of 1 MHz). A sigma-delta modulator can also be used as a digital/digital converter (D/D converter), which converts a digital pulse sequence of high resolution (e.g. 16 it) and low scanning rate (e.g. 48 kHz) into a digital pulse sequence of low resolution (e.g. 1 bit) and high scanning rate (e.g. 1 Mz). An application for this type of D/D converter is described, e.g., in DE-A 198 19 069. This publication shows that an analog signal can be multiplied with a digital signal with the help of a purely digital sigma-delta modulator. This principle is used there for analysis of an analog sensor signal. Sigma-delta modulators of $2^{nd}$ order with a one bit quantization are, for example, described in the article "A Use of Double Integration in Sigma Delta Modulation", by J. Candy, IEEE, Transactions on Communications", March 1985. The modulator described there comprises a $1^{st}$ order modulator, which has an added feedback loop. It was pointed out in this reference that in the case of 1 bit quantization further feedback loops for increasing the modulation degree (degree $\geq 3$) lead to unstable structures.

Topologies that guarantee the stability of a sigma-delta modulator with 1 bit quantization with suitable dimensions are described in "Theory and Practical Implementation of a Fifth-Order Sigma-Delta AID Converter", by R. W. Adams, et al, J. Audio Eng. Soc., Vol. 39, Nr. 718, 1991. The named article relates, for example, to an A/D converter with a $5^{th}$ order sigma-delta modulator and a 1-bit quantization.

Sigma-delta modulators can also be used for other purposes than for A/D or D/A converter. For example, the use of several purely digital sigma-delta modulators inside an IIR filter was described in "IIR Filtering on Sigma-delta Modulated Signals", D. A. Johns, et al, Electronics Letters 14, February 1991, Vol. 27, Nr. 4. Non-linear operations on a data stream of a sigma-delta modulator is described in "Nonlinear Arithmetic Operations on the Delta Sigma Pulse Stream", M. Freeman, et al, Signal Processing 21, Elsevier Science Publishers, pp. 25 to 35 (1990).

SUMMARY OF THE INVENTION

It is an object of the present invention to provide a sigma-delta modulator in which quantization errors or quantization noise can be suppressed in an effective manner.

This object is attained by a sigma-delta modulator for conversion of an analog or digital low frequency input signal of high resolution into a quantized analog or digital signal, with an error feedback circuit for suppression of quantization errors, which comprises means for delaying the input signal X for a plurality of time intervals to obtain a plurality of delayed input signals $X_i$ wherein i=1, 2, . . . , n and the ith one of the delayed input signals Xi is delayed for i scanning periods;

means for addition of the delayed input signals $X_i$ each delayed by i scanning periods to obtain a sum signal $S_i$;

means for producing quantized input signals $VZ_i$ each delayed by the i scanning periods;

means for addition of the delayed quantized input signals $VZ_i$ to obtain a second sum signal $S_2$; and means for subtraction of the sum signals $S_1$ and $S_2$ from the actual value of the input signal.

The value of n corresponding to a desired order of the sigma-delta modulator can be, e.g., between 1 and 20. Also other values are conceivable, for example n=5. Good results may be obtained, e.g., also with a $3^{rd}$ order sigmadelta modulator (n=3). A very effective suppression of quantization noise takes place in the sigma-delta modulator according to the invention.

The object of the invention is also attained by a method of suppressing quantization errors occurring in the conversion of an analog or digital low frequency input signal X of high resolution to a quantized analog or digital signal Y in a sigma-delta modulator having an error feedback circuit. This method has the following steps:

a) quantizing the input signal X according to a scanning rate $f_A$ at a time t=m·Ta , wherein m=0,1,2, . . . and Ta is the scanning period of the sigma-delta modulator;

b) delaying the input signal for plurality of time intervals to obtain a plurality of delayed input signals $X_i$ wherein i=1, 2, . . . , n and the ith delayed input signal is delayed for i scanning periods;

c) adding the delayed input signals $X_i$ each delayed for i scanning periods to obtain a first sum signal $S_i$;

d) producing quantized input signals and delaying them by a plurality of time intervals to obtain a plurality of delayed quantized input signals $VZ_i$ wherein i=1, 2, . . . , n and the ith quantized input signal is delayed for i scanning periods;

e) adding the delayed quantized input signals $VZ_i$ to obtain a second sum signal $S_2$; and f) subtracting the sum signals $S_1$ and $S_2$ from the actual value of the input signal X.

Advantageous embodiments of the sigma-delta modulator and the method according to the invention are set forth the appended dependent claims and additional description below.

According to a preferred embodiment of the sigma-delta modulator it has means for multiplying the respective delayed input signals $X_i$ with respective coefficients $d_i$ of a transformation function so that the first sum $S_1$ can be represented by $S_1 = \Sigma d_i \, X_i$ and means for multiplying the respective delayed, quantized input signals $VZ_i$ with respective coefficients $c_i$ of the transformation function so that the second sum $S_2$ can be represented by $S_2 = \Sigma c_i \, VZ_i$. The transformation function of the sigma-delta modulator according to the invention is, for example, representable in the following form:

$$Y(z) = X(z) \cdot \{a_0[1 + (c_1+d_1) \cdot z^{-1} + (c_2+d_2) \cdot z^{-2} + \ldots + (c_n+d_n) \cdot z^{-n}]\}$$
$$+ E(z) \cdot \{[1 + d_1 \cdot z^{-1} + d_2 \cdot z^{-2} + \ldots + d_n \cdot z^{-n}]/[1 + (c_1+d_1) \cdot z^{-1} + (c_2+d_2) \cdot z^{-2} + \ldots + (c_n+d_n) \cdot z^{-n}]\} \quad (1)$$

The transformation function of the system is represented here with the help of a Z transformation. Z is a frequency variable for representation of the transformation function in frequency space. $X(z)$ or $Y(z)$ is the Z-transformed (frequency spectrum) input signal X or the output signal Y. $E(z)$ represents the Z-transformed (frequency spectrum) noise signal. The occurring quantization error e is defined as the difference between the input and output signal of a suitable quantization. The numerator and the denominator of the noise transformation function (factor for $E(z)$) and the denominator of the signal transformation function (factor for $X(z)$) may be adjusted by choice of the coefficients $c_i$ and $d_i$ performed according to the invention. Usually the signal transformation function is dimensioned as a low-pass filter and the noise transformation is dimensioned as a high-pass filter, whereby the resulting noise in the output signal Y can be kept small in the low frequency band (i.e. in the frequency band of the input signal).

Advantageously the sigma-delta modulator according to the present invention has means for depositing or storing $2^n$ possible states of the second sum signal $S_2$ according to the transformation function and the corresponding choice for the coefficients $c_i$, so that a particular or specific state is detectable without the necessity of explicitly performing the summation operation and is output as a suitable sum signal $S_2$. Since the quantized signals $VZ_1, VZ_2, \ldots, VZ_n$ (respectively ±1) can take only $2^n$ different states the fact that the sum $\Sigma VZ_i c_i$ need not be computed in each scanning step is guaranteed. Furthermore all possible $2^n$ different results can be computed in advance and stored in a suitable manner. The computational work is therefore substantially reduced in comparison to conventional sigma-delta modulators because of the reduction of the multiplication and addition operations.

BRIEF DESCRIPTION OF THE DRAWING

The objects, features and advantages of the invention will now be illustrated in more detail with the aid of the following description of the preferred embodiments, with reference to the accompanying figures in which.

DESCRIPTION OF THE PREFERRED EMBODIMENTS

Figure 1:
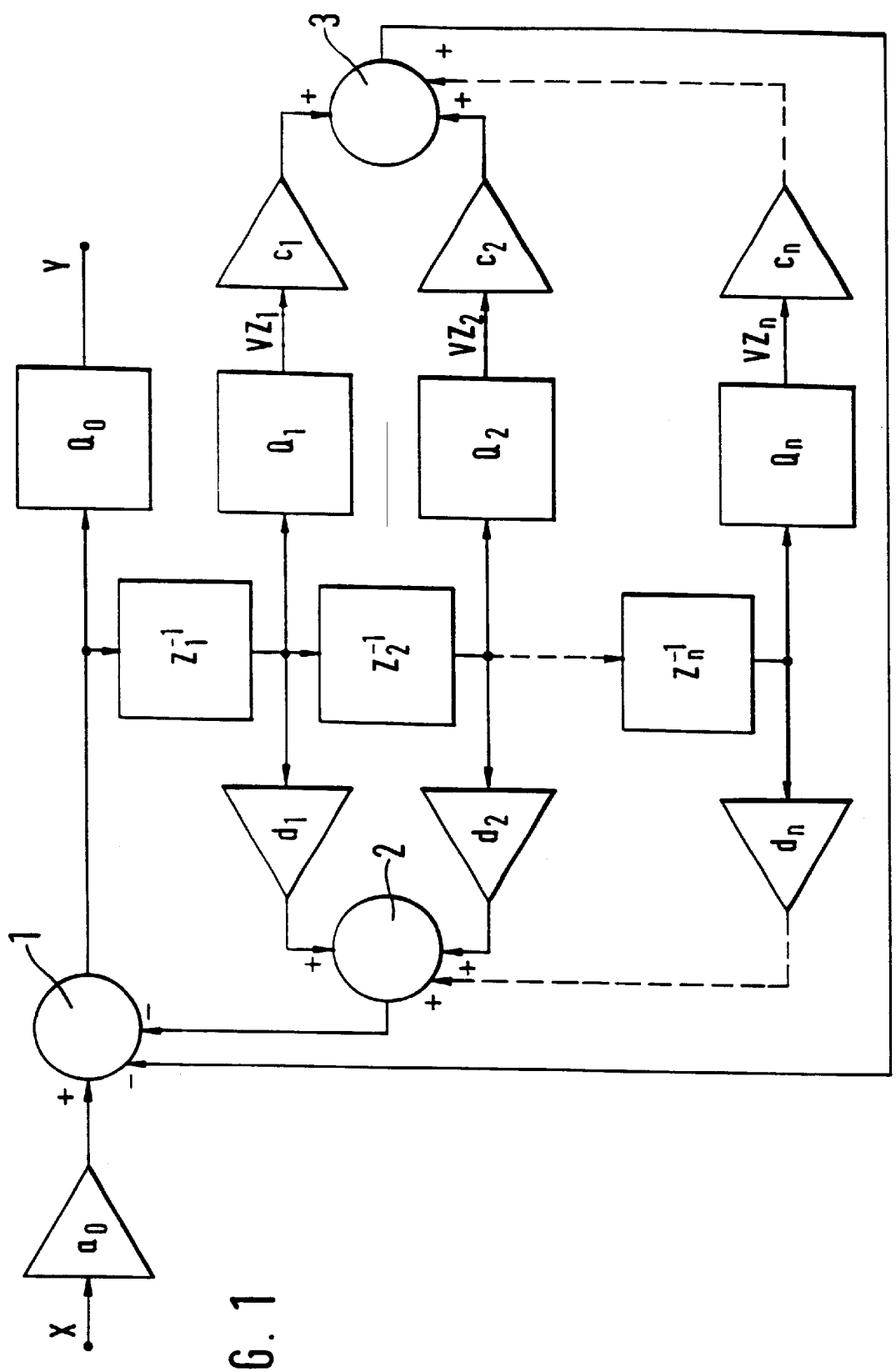
FIG. 1 is a schematic block diagram of an nth order sigma-delta modulator according to the invention.

In FIG. 1 the basic structure of an nth order sigma-delta modulator according to the invention is shown. X represents the analog or digital input signal and Y represents the analog or digital quantized output signal at discrete time points $m \cdot Ta$ ($m = 0, 1, 2, \ldots$). The Ta represents the scanning period of the sigma-delta modulator.

The triangular blocks represent means $d_1, d_2, d_3$; $c_1, c_2, c_3$ for multiplying an input signal with the respective entered coefficients $c_i$ or $d_i$ (multiplication component). The drawing figure is simplified by using the respective coefficient multiplier as the reference symbol for the respective means for multiplying. The circles 1, 2 and 3 represent means for addition. The symbol $Z^{-1}$ indicates a delay of about one scanning period Ta.

Means for quantizing are indicated with the reference characters $Q_0, Q_1, Q_n$, which perform a coarse quantization of an input signal. The quantization usually results in only two possible values, for example ±1 in the case of a digital quantization, or $\pm U_{ref}$ in the case of an analog quantization and a reference voltage $U_{ref}$, which can amount to, e.g., 1 volt.

The transformation function of the system can be represented with the help of the Z transformation in the following form:

$$Y(z) = X(z) \cdot \{a_0[1 + (c_1+d_1) \cdot z^{-1} + (c_2+d_2) \cdot z^{-2} + \ldots + (c_n+d_n) \cdot z^{-n}]\}$$
$$+ E(z) \cdot \{[1 + d_1 \cdot z^{-1} + d_2 \cdot z^{-2} + \ldots + d_n \cdot z^{-n}]/[1 + (c_1+d_1) \cdot z^{-1} + (c_2+d_2) \cdot z^{-2} + \ldots + (c_n+d_n) \cdot z^{-n}]\} \quad (1)$$

Here, as already mentioned above, $X(z)$ or $Y(z)$ are the Z-transformations of the respective input signal X or output signal Y. $E(z)$ represents the Z-transformation of the quantization error $e(m \cdot Ta)$ originating from upmost quantizer $Q_1$. The occurring quantization error is defined as the difference between the input and output signal of a suitable quantization.

A suitable form for the transformation function (1) results by means of suitable selection of the coefficients $c_i$ or $d_i$.

The input signal X is first multiplied with the coefficient $a_0$. Subsequently the resulting signal is input to a quantizer $Q_0$ to obtain the output signal Y. The signal fed to the quantizer $Q_0$ can be modified by means of an error feedback circuit. The error feedback circuit has delay elements $Z^{-1}{}_1$, $Z^{-1}{}_2$, $Z^{-1}{}_3$; quantizers $Q_1$ to $Q_n$, and means $d_1, d_2, d_3$; $c_1, c_2, c_3$ for multiplying the transformed function $Y(Z)$ with the coefficients $c_i$ to $c_n$ or $d_i$ to $d_n$. After a delay by a first delay element $Z^{-1}{}_1$ an input signal quantity X is fed to a means $d_1$ for multiplying, a further delay element $Z^1{}_2$ and a second quantizer $Q_1$ as delayed input signal quantity $X_1$. The second delay element $Z^{-1}{}_2$ correspondingly feeds a delayed input signal quantity $X_2$ delayed by about two scanning periods to a second means $d_2$ for multiplying, a further delay element $Z^{-1}$ and a further quantizer $Q_2$. A suitable delay and further conduction of the delayed input signal to an nth delay element $Z^{-1}$ occurs according to the order of the sigma-delta modulator.

The delayed input signals $X_i$ multiplied by the coefficients $d_1$ to $d_n$ are input to the means 2 for addition, in which a first sum $\Sigma d_i X_i$ is formed.

The delayed input signals $X_i$ are fed further to the quantizers $Q_1$ to $Q_n$. A coarse quantization of the delayed input signals $X_i$ occurs in the quantizers $Q_1$ to $Q_n$.

Usually the signs $VZ_1$ to $VZ_n$ appear at the respective outputs of the quantizers $Q_1$ to $Q_n$. The output $VZ_1$ to $VZ_n$ are multiplied by the respective coefficients $c_1$ to $c_n$. The resulting products are fed to a means 3 for adding to form a second sum $\Sigma c_i VZ_i$.

The sums computed by the means 2,3 for adding are input to a means 1 for subtracting, and there subtracted from the actual value of the input signal X.

Figure 2:
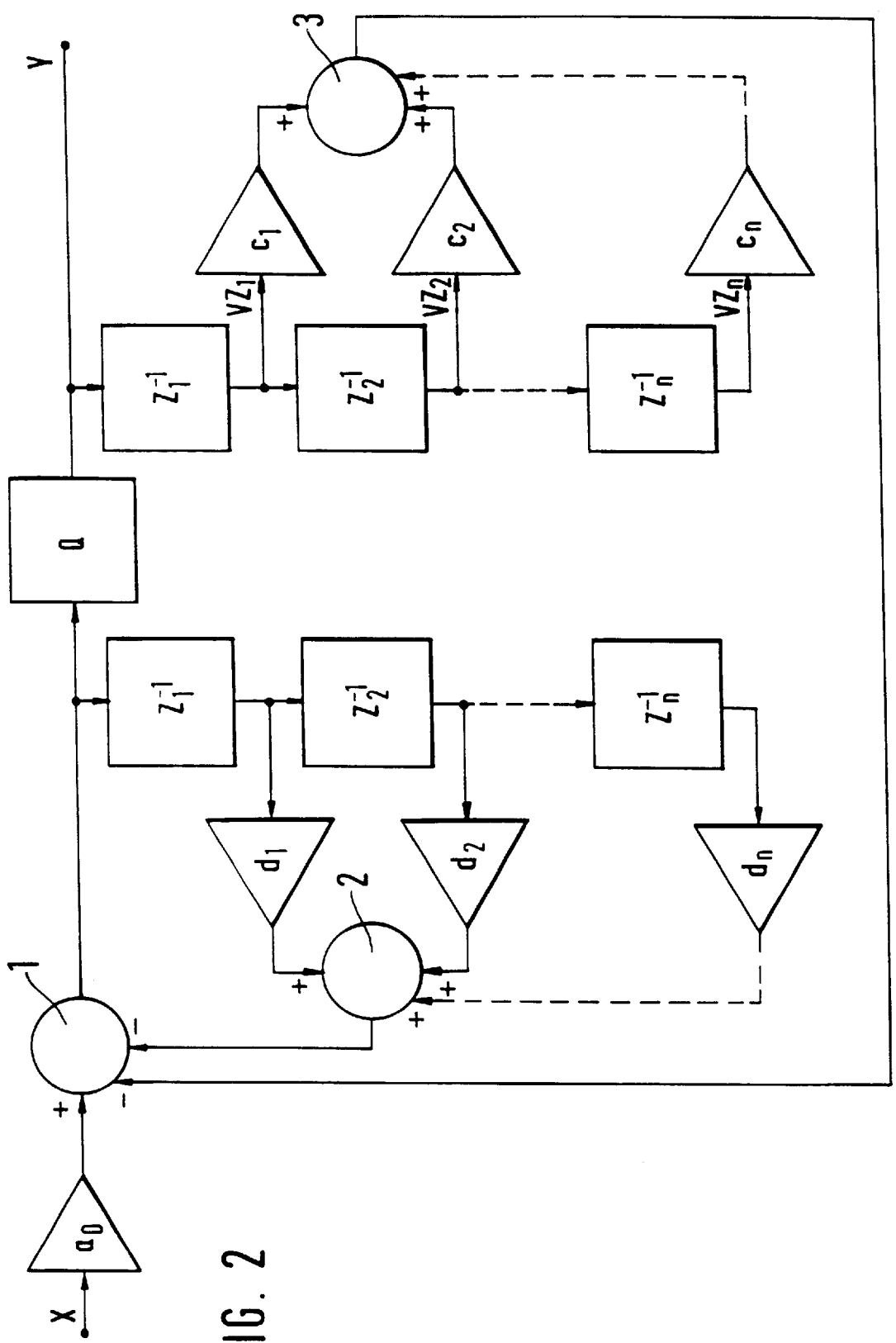
FIG. 2 is a schematic block diagram of the structure of a sigma-delta modulator with a separate delay chain for the quantized signal according to the invention.

An additional embodiment of the sigma-delta modulator according to the invention is shown in FIG. 2. The embodiment of FIG. 2 provides an alternative to the embodiment of FIG. 1, in which only one quantizer Q is provided. A separate delay network is provided for the quantized signal. The transformed signal or the error feedback occurs in the analogous manner to the embodiment of FIG. 1.

Figure 3:
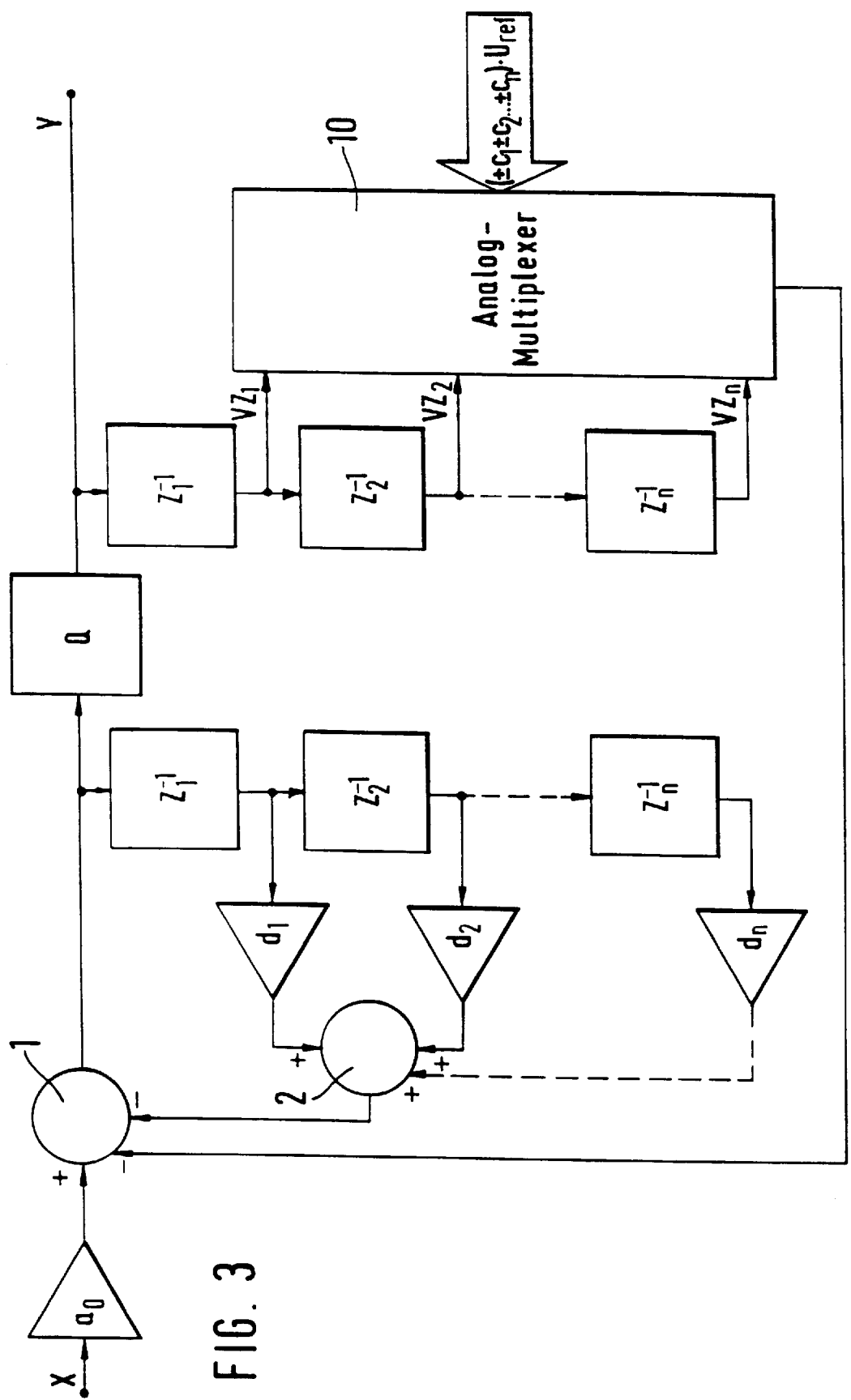
FIG. 3 is a schematic block diagram of an A/D converter comprising a sigma-delta modulator according to the invention.

In the embodiment of the sigma-delta modulator according to FIG. 3 the input signal X is an analog signal. Thus the adders 1,2, the multipliers $a_0$, $d_1$ to $d_n$ and the linked delay network or chain with the delay elements $Z^{-1}$ are embodied in analog technology. Analog delay chains are usually embodied in SC technology (switched capacitor) according to the state of the art. The quantizer Q can, for example, by formed as a comparator, which supplies a digital signal at its output. With 1 bit quantization this digital signal is, for example, in the state ±1 (comparator input signal $\geq 0$) and −1 (comparator input signal <0) and thus outputs the sign VZ of the input signal. The correct delay network with delay elements $Z^{-1}$ is digital (for example 1 bit wide).

That the quantized signals $VZ_1$ to $VZ_n$ (respectively ±1) can only take $2^n$ different states is a particular advantage of the sigma-delta modulator according to the invention. The embodiments shown with the fundamental structures shown in FIGS. 1 and 2 do not compute the sum $\Sigma c_i VZ_i$ to be formed according to the invention in each scanning step. It is sufficient to calculate in advance all possible $2^n$ different results according to the chosen $c_i$ and to store them. In that way multiplication and addition operations can be eliminated. In the case of the A/D converter shown in FIG. 3 this is accomplished by an analog multiplexer 10, which has n digital control inputs $VZ_1$ to $VZ_n$ and one of $2^n$ analog voltages at its output. The analog voltages are derived from a reference potential $\pm U_{ref}$ (e.g. ±1 volt) by a passive voltage divider in a known manner. The required analog voltages are $(\pm c_1, \pm c_2, \pm c_n) \cdot U_{ref}$ according to the selected coefficients $c_i$ of the transformation function Y(z).

Figure 4:
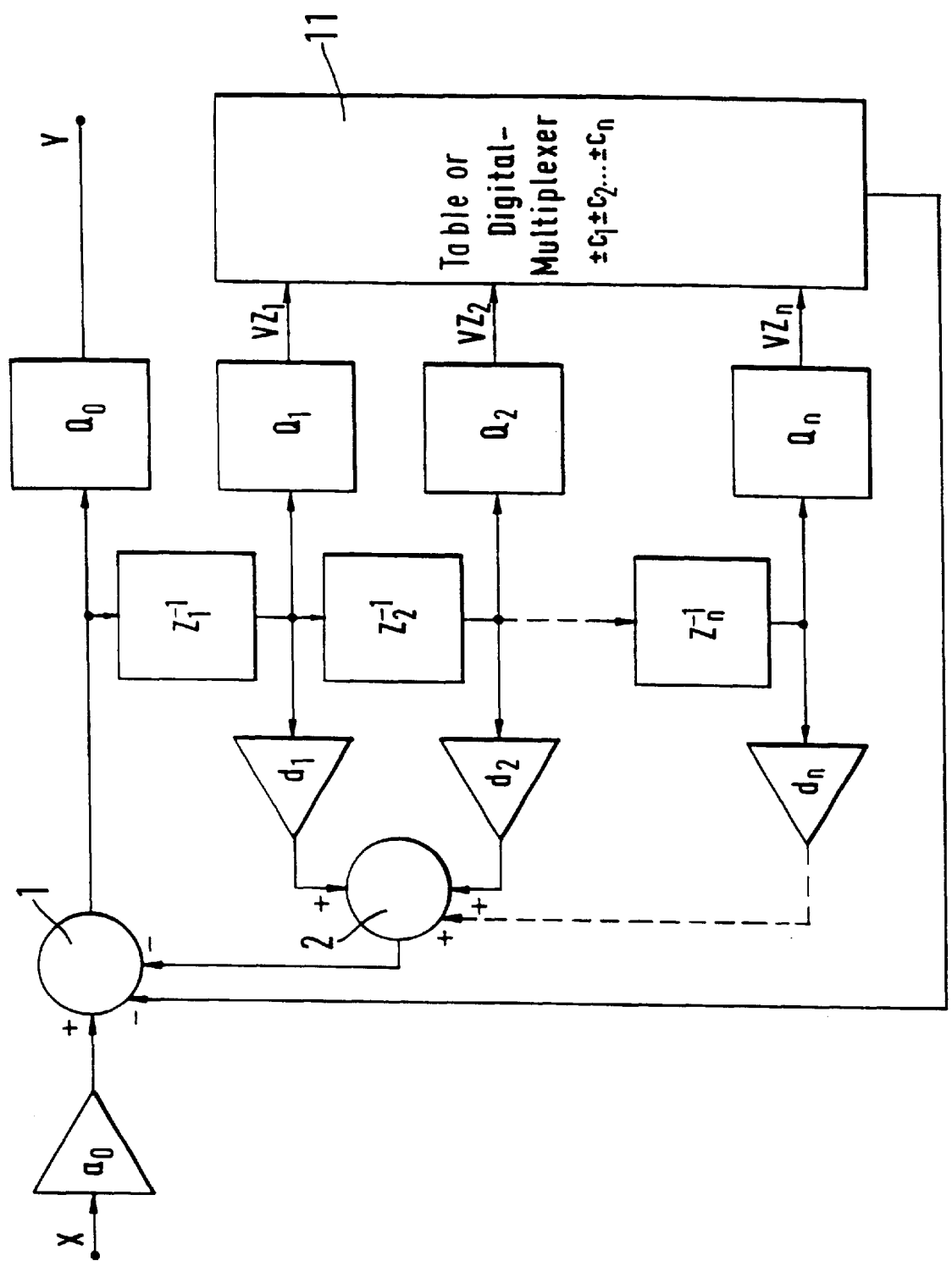
FIG. 4 is a schematic block diagram of a D/D converter comprising a sigma-delta modulator according to the invention.

In FIG. 4 a D/D converter is shown, in which all the elements are digital. A plurality of quantizers $Q_0$ to $Q_n$ are provided according to the structure of the sigma-delta modulator of FIG. 4. These quantizers result in no additional circuit expense, since it is sufficient to quantize a signal of long word length (for example 16 bit) so that only the highest bit (sign it in the two's complement representation) is processed further. The preparation of the $2^n$ digital values occurs here for example by means of a table, which can be provided as a ROM, or by a digital multiplexer 11, at whose inputs the above-described digital values $VZ_i$ are applied.

Figure 5:
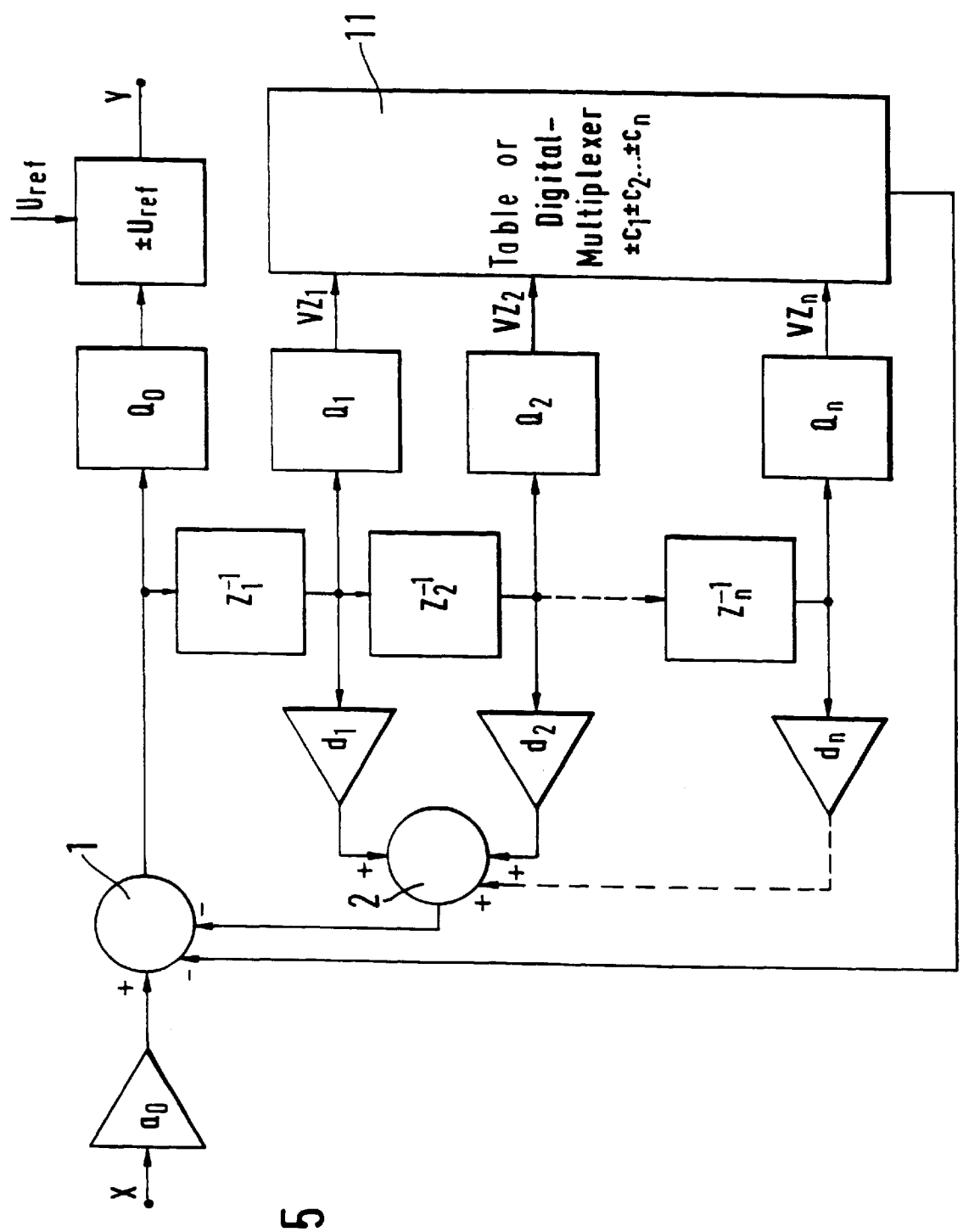
FIG. 5 is a schematic block diagram of a D/A converter comprising a sigma-delta modulator according to the invention.

In FIG. 5 a D/A converter is shown which is based on the sigma-delta modulator according to the invention. The structure correspond essentially to the structure of the D/D converter in FIG. 4, however an analog signal must be formed with both voltage values $\pm U_{ref}$ at the output of the highest quantizer $Q_0$ from the 1 bit signal. A table or a digital multiplexer 11 is provided again for storage of the $2^n$ possible values of the second sum $\Sigma c_i VZ_i$.

The disclosure in German Patent Application 198 51 637.1 of Nov. 10, 1998 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a sigma-delta modulator and method for suppressing a quantization error in a sigma-delta modulator, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

1. A sigma-delta modulator for conversion of an analog or digital low frequency input signal (X) of high resolution into a quantized analog or digital signal (Y), with an error feedback circuit for suppression of quantization errors, said sigma-delta modulator comprising means ($Z^{-1}$) for delaying the input signal (X) for a plurality of time interval to obtain a plurality of delayed input signals ($X_i$), wherein i=1, 2, . . . , n and the ith one of the delayed input signals ($X_i$) is delayed for i scanning periods;

means (2) for addition of the delayed input signals ($X_i$) each delayed by said i scanning periods to obtain a first sum signal ($S_1$);

means (Q, $Q_0$, $Q_1$ to $Q_n$) for producing quantized input signals ($VZ_i$) each delayed by said i scanning periods;

means (3) for addition of the delayed quantized input signals ($VZ_i$) to obtain a second sum signal ($S_2$); and means (1) for subtraction of the sum signals ($S_1$, $S_2$) from an actual value of the input signal (X).

2. The sigma-delta modulator as defined in claim 1, further comprising means ($d_1$ to $d_n$) for multiplying said delayed input signals ($X_i$) with respective first coefficients ($d_i$) of a transformation function of the sigma-delta modulator so that the first sum signal ($S_1$)$_{is}$ in the form $\Sigma d_i X_i$, and means ($c_i$) for multiplying said delayed quantized input signals ($VZ_i$) with respective second coefficients ($c_i$) so that said second sum signal ($S_2$) is in the form $\Sigma c_i VZ_i$.

3. The sigma-delta modulator as defined in claim 2, further comprising means (10,11,12) for storing $2^n$ possible states of said second sum signal ($S_2$) according to said transformation function and a selected choice for said second coefficients ($c_i$).

4. A method for suppression of quantization errors during conversion of an analog or digital low frequency input signal (X) of high resolution into a quantized analog or digital signal (Y) in a sigma-delta modulator having an error feedback circuit for suppression of the quantization errors, said method comprising the steps of:

a) quantizing the input signal (X) according to a scanning rate $f_A$ at a time t=m·Ta, wherein m=0,1,2, . . . and said Ta is the scanning period of the sigma-delta modulator;

b) delaying the input signal (X) for plurality of time intervals to obtain a plurality of delayed input signals ($X_i$) wherein i=1, 2, . . . n and the ith delayed input signal is delayed for i scanning periods;

c) adding the delayed input signals ($X_i$) for i scanning periods to obtain a first sum signal ($S_1$);

d) producing quantized input signals ($VZ_i$) and delaying said quantized input signals ($VZ_i$) by a plurality of time intervals to obtain a plurality of delayed quantized input signals $VZ_i$ wherein i=1, 2, ..., n and the ith quantized input signal is delayed for said i scanning periods;

e) adding the delayed quantized input signals ($VZ_i$) to obtain a second sum signal ($S_2$); and f) subtracting the sum signals ($S_1$, $S_2$) from an actual value of the input signal (X).

* * * * *